(12) United States Patent
Koike et al.

(10) Patent No.: US 8,760,913 B2
(45) Date of Patent: Jun. 24, 2014

(54) MAGNETIC DETECTING ELEMENT AND MAGNETIC SENSOR UTILIZING SAME

(71) Applicant: Alps Electric Co., Ltd., Tokyo (JP)

(72) Inventors: Fumihito Koike, Tokyo (JP); Kota Asatsuma, Tokyo (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 13/708,308

(22) Filed: Dec. 7, 2012

(65) Prior Publication Data

US 2013/0257581 A1    Oct. 3, 2013

(30) Foreign Application Priority Data

Mar. 30, 2012    (JP) ................................. 2012-081916

(51) Int. Cl.
*G11C 11/00*    (2006.01)

(52) U.S. Cl.
USPC .................. 365/158; 365/46; 365/55; 365/74; 365/97; 365/100; 365/131; 365/148; 365/171; 365/163

(58) Field of Classification Search
USPC ......... 365/46, 55, 74, 97, 100, 131, 148, 158, 365/171, 173, 163
See application file for complete search history.

(56) References Cited

U.S. PATENT DOCUMENTS

| 5,583,725 | A | 12/1996 | Coffey et al. |
| 6,972,934 | B2 * | 12/2005 | Horng et al. ............. 360/324.11 |
| 2006/0198060 | A1 | 9/2006 | Ishizone et al. |
| 2008/0068767 | A1 | 3/2008 | Nakabayashi et al. |
| 2009/0027813 | A1 | 1/2009 | Carey et al. |

FOREIGN PATENT DOCUMENTS

EP    1 850 144    10/2007

OTHER PUBLICATIONS

Extended European Search Report from corresponding European Application No. 12190552.5 mailed Jul. 7, 2013.

* cited by examiner

*Primary Examiner* — Fernando Hidalgo
(74) *Attorney, Agent, or Firm* — Hunton & Williams LLP

(57) ABSTRACT

A magnetic detecting element includes a laminated structure where a fixed magnetic layer and a free magnetic layer are laminated through a non-magnetic material layer, wherein the fixed magnetic layer is a self-pinned type where a first magnetic layer and a second magnetic layer are laminated through a non-magnetic intermediate layer and the first magnetic layer and the second magnetic layer are antiparallelly magnetization-fixed, and the second magnetic layer is in contact with the non-magnetic material layer. The first magnetic layer is formed using FeCo serving as a material having a higher coercive force than the second magnetic layer. The film thickness of the first magnetic layer falls within a range greater than or equal to 10 Å and less than or equal to 17 Å, and is thinner than the film thickness of the second magnetic layer. The non-magnetic intermediate layer is formed using Rh.

6 Claims, 6 Drawing Sheets

FILM THICKNESS OF NON-MAGNETIC INTERMEDIATE LAYER (Å)

MAGNETIC DETECTING ELEMENT AND MAGNETIC SENSOR UTILIZING SAME

CLAIM OF PRIORITY

This application contains subject matter related to and claims the benefit of Japanese Patent Application No. 2012-081916 filed on Mar. 30, 2012, the entire contents of which is incorporated herein by reference.

BACKGROUND OF THE DISCLOSURE

1. Field of the Disclosure

The present disclosure relates to a self-pinned-type magnetic detecting element.

2. Description of the Related Art

Usually, a magnetic sensor including a magnetic detecting element has been paired with a permanent magnet, and, for example, in an automotive sensor, environment resistance in a magnetizing field of several tens or more of mT has been important under a high-temperature environment of 100° C. or more.

On the other hand, in the case of a geomagnetism sensor used for a mobile phone or the like, a capability for detecting geomagnetism with a high sensitivity is desirable without using a permanent magnet. In the case of the geomagnetism sensor, while higher heat resistance than an automotive sensor or the like has not been desired, good disturbance noise tolerance has been desired so as to maintain a stable high sensitivity characteristic.

U.S. Pat. No. 6,972,934 discloses a magnetic detecting element utilizing an antiferromagnetic layer is disclosed. However, in the magnetic detecting element utilizing an antiferromagnetic layer, magnetic field heat treatment is desired that is used for assigning unidirectional anisotropy of a fixed magnetic layer without dispersion. Therefore, owing to the magnetic field heat treatment, a free magnetic layer is also assigned with an easy axis in the fixed magnetization direction of the fixed magnetic layer. Accordingly, the coercive force Hc of the free magnetic layer becomes large, and hence, it has been difficult to obtain a small coercive force Hc suitable for the geomagnetism sensor. As a result, there has occurred a problem that, owing to a ΔMR characteristic (ΔMR-H curved line; the ΔMR indicates a resistance change rate (ΔR/R), and the H indicates an external magnetic field), a hysteresis becomes large, linearity is poor, and detection accuracy is reduced.

On the other hand, as illustrated in U.S. Pat. No. 5,583,725, in the case of a self-pinned-type magnetic detecting element, since the self-pinned-type magnetic detecting element has a structure not including an antiferromagnetic layer, the magnetic field heat treatment may be unnecessary.

In a self-pinned type, there has occurred a problem that when a strong external magnetic field (disturbance magnetic field) is applied, a fixed magnetic layer including an artificial-antiferromagnetic (AAF) structure is subjected to magnetization dispersion, the deterioration rate of a ΔMR (resistance change rate) becomes large, and furthermore, the output fluctuation of a geomagnetism sensor becomes large. In other words, in a self-pinned-type magnetic detecting element of the related art, it has been difficult to obtain good disturbance noise tolerance. While a geomagnetism sensor detects weak geomagnetism (a magnetic field to be detected), since a strong external magnetic field (disturbance magnetic field) from a speaker or the like easily affects the geomagnetism sensor under a circumstance that the geomagnetism sensor is embedded in a mobile phone or the like, in particular it may be important to improve the disturbance noise tolerance, compared with heat resistance or the like.

While U.S. Pat. No. 5,583,725 discloses a self-pinned-type magnetic detecting element, in U.S. Pat. No. 5,583,725, the structure of a magnetic detecting element is not disclosed that is suitable for improving the disturbance noise tolerance with respect to a case where the self-pinned-type magnetic detecting element is applied to a magnetic sensor such as a mobile phone, which does not embed therein a permanent magnet.

These and other drawbacks exist.

SUMMARY OF THE DISCLOSURE

Embodiments of the present disclosure solves the above-mentioned problem of the related art, and in particular, provides a self-pinned-type magnetic detecting element capable of improving the disturbance noise tolerance compared with the relate art, and a magnetic sensor utilizing the self-pinned-type magnetic detecting element.

Embodiments of the present disclosure provide a magnetic detecting element used in a magnetic sensor embedding therein no permanent magnet, the magnetic detecting element including a laminated structure where a fixed magnetic layer and a free magnetic layer are laminated through a non-magnetic material layer, wherein the fixed magnetic layer is a self-pinned type where a first magnetic layer and a second magnetic layer are laminated through a non-magnetic intermediate layer and the first magnetic layer and the second magnetic layer are antiparallelly magnetization-fixed, and the second magnetic layer is in contact with the non-magnetic material layer, the first magnetic layer is formed using FeCo serving as a material having a higher coercive force than the second magnetic layer, the film thickness t1 of the first magnetic layer falls within a range greater than or equal to 10 Å and less than or equal to 17 Å, and is thinner than the film thickness of the second magnetic layer, a difference in magnetization amount between the first magnetic layer and the second magnetic layer is substantially zero, and the non-magnetic intermediate layer is formed using Rh. Accordingly, it may be possible to improve disturbance noise tolerance compared with the related art. In particular, according to the present disclosure, it may be possible to obtain good disturbance noise tolerance compared with a self-pinned-type magnetic detecting element utilizing Ru for a non-magnetic intermediate layer. In addition, according to the present invention, it may be possible to obtain a ΔMR characteristic where a hysteresis is small and linearity is good compared with a magnetic detecting element utilizing an antiferromagnetic layer, and it may be possible to obtain good detection accuracy.

According to the present disclosure, the film thickness of the non-magnetic intermediate layer is formed within a range greater than or equal to 4.9 Å and less than or equal to 5.9 Å. It may be possible to stably obtain a high resistance change rate (ΔMR).

In addition, according to the present disclosure, the film thickness t1 of the first magnetic layer is greater than or equal to 10 Å and less than or equal to 13 Å. Furthermore, the film thickness t1 of the first magnetic layer is greater than or equal to 10 Å and less than or equal to 12.5 Å.

It may be possible to more effectively improve the disturbance noise tolerance.

In addition, embodiments of the present disclosure provide a magnetic sensor embedding therein no permanent magnet, wherein the above-described magnetic detecting element is disposed on a substrate. Accordingly, it may be possible to obtain a magnetic sensor embedding therein no permanent magnet and having good disturbance noise tolerance.

DETAILED DESCRIPTION OF THE DISCLOSURE

The following description is intended to convey a thorough understanding of the embodiments described by providing a number of specific embodiments and details involving a magnetic detecting element. It should be appreciated, however, that the present invention is not limited to these specific embodiments and details, which are exemplary only. It is further understood that one possessing ordinary skill in the art, in light of known systems and methods, would appreciate the use of the invention for its intended purposes and benefits in any number of alternative embodiments, depending on specific design and other needs.

Figure 1:
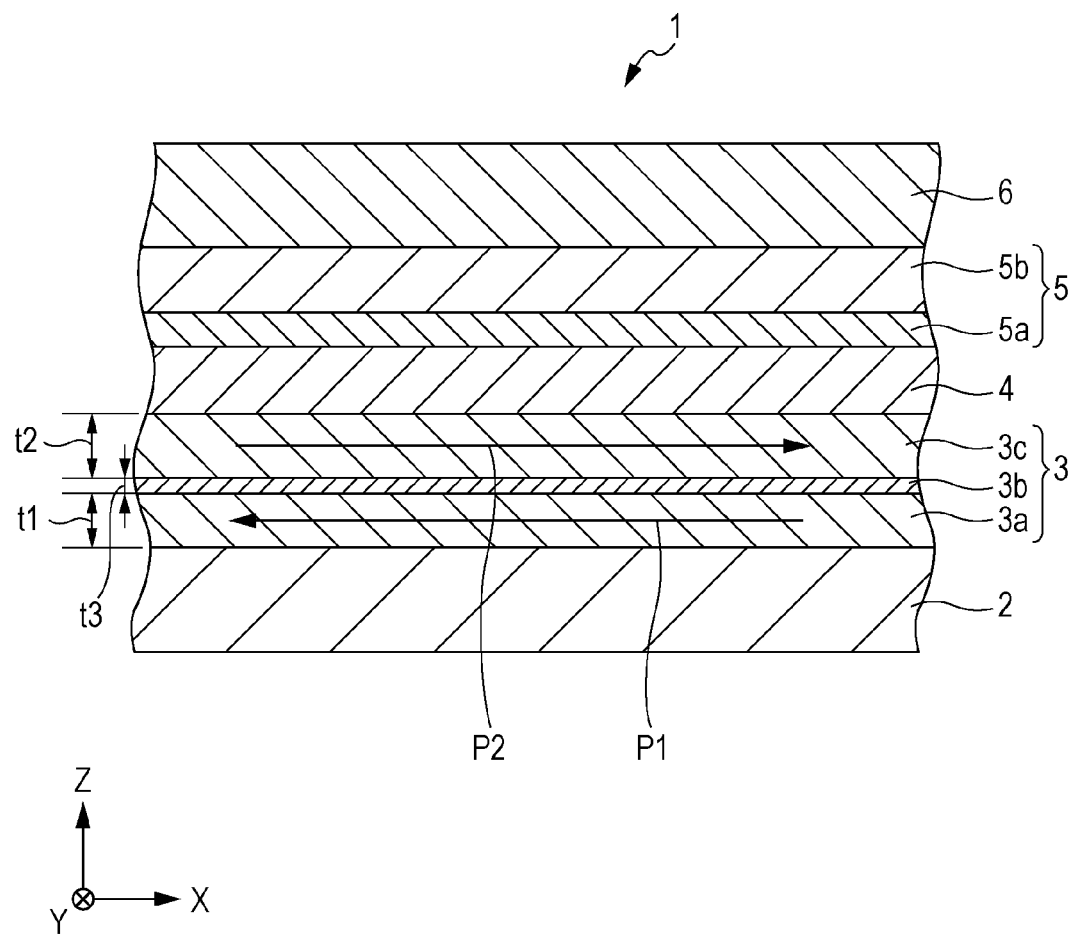
FIG. 1 is a partially enlarged vertical cross-sectional view of a magnetic detecting element in an exemplary embodiment.

FIG. 1 is the partially enlarged vertical cross-sectional view of a magnetic detecting element in an exemplary embodiment.

As illustrated in FIG. 1, the magnetic detecting element (GMR element) 1 may be subjected to film formation by laminating a seed layer 2, a fixed magnetic layer 3, a non-magnetic material layer 4, a free magnetic layer 5, and a protective layer 6 from the bottom in this order. Each layer configuring the magnetic detecting element 1 may be subjected to film formation using, for example, sputtering.

The seed layer 2 may be formed using NiFeCr, Cr, or the like. In addition, the film thickness of the seed layer 2 may be about 36 to 60 Å. Between the seed layer 2 and a substrate not illustrated, a base layer may be formed that includes Ta, Hf, Nb, Zr, Ti, Mo, W, or the like.

The fixed magnetic layer 3 may have an AAF structure including a first magnetic layer 3a, a second magnetic layer 3c, and a non-magnetic intermediate layer 3b lying between the first magnetic layer 3a and the second magnetic layer 3c.

As illustrated in FIG. 1, the fixed magnetization direction (P1) of the first magnetic layer 3a and the fixed magnetization direction (P2) of the second magnetic layer 3c are antiparallel to each other. Here, the fixed magnetization direction of the fixed magnetic layer 3 may be specified as the fixed magnetization direction (P2) of the second magnetic layer 3c.

As illustrated in FIG. 1, the first magnetic layer 3a may be formed on the seed layer 2, and the second magnetic layer 3c is formed so as to be contact with a non-magnetic material layer 4 described later.

The first magnetic layer 3a may be formed using $Fe_xCo_{100-x}$ (in this regard, however, the "x" is greater than or equal to approximately 55 at % and less than or equal to approximately 65 at %) serving as a higher coercive force material than the second magnetic layer 3c.

In addition, in the view in FIG. 1, the film thickness t1 of the first magnetic layer 3a falls within a range greater than or equal to 10 Å and less than or equal to 17 Å, and may be thinner than the film thickness t2 of the second magnetic layer 3c.

Accordingly, it may be possible to set the coercive force Hc of the first magnetic layer 3a to 30 (kA/m) or more, it may be possible to desirably set the coercive force Hc to 40 (kA/m) or more, and it may be possible to more desirably set the coercive force Hc to a stable value greater than or equal to 50 (kA/m).

The second magnetic layer 3c being in contact with the non-magnetic material layer 4 may be a layer contributing to a magnetoresistance effect (GMR effect), and, for the second magnetic layer 3c and the free magnetic layer 5, a magnetic material may be selected that is able to increase a difference between the mean free paths of a conduction electron having an up-spin and a conduction electron having a down-spin.

Specifically, the second magnetic layer 3c may be formed using $Co_yFe_{100-y}$ (in this regard, however, the "y" may be greater than or equal to approximately 85 at % and less than approximately 100 at %).

In addition, within a range greater than or equal to 12 Å and less than or equal to 22 Å, the film thickness t2 of the second magnetic layer 3c is formed so as to be thicker than the film thickness t1 of the first magnetic layer 3a.

The film thicknesses t1 and t2 of the first magnetic layer 3a and second magnetic layer 3c, respectively, may be adjusted so that a difference in magnetization amount (saturation magnetization Ms• film thickness t) between the first magnetic layer 3a and the second magnetic layer 3c becomes substantially zero.

Here, the term "substantially zero" means that the absolute value of [(the magnetization amount of the first magnetic layer 3a−the magnetization amount of the second magnetic layer 3c)/the average magnetization amount of the first magnetic layer 3a and the second magnetic layer 3c] may be less than or equal to approximately 0.7%.

The fixed magnetic layer 3 may be a self-pinned type due to an AAF structure. In other words, the fixed magnetic layer 3 may have a configuration including no antiferromagnetic layer.

In addition, the non-magnetic intermediate layer 3b located between the first magnetic layer 3a and the second magnetic layer 3c is formed using Rh. In addition, it may be that the film thickness t3 of the non-magnetic intermediate layer 3b is greater than or equal to 4.9 Å and less than or equal to 5.9 Å. Accordingly, it may be possible to effectively obtain a stably high ΔMR.

The non-magnetic material layer 4 may be formed using a non-magnetic conductive material such as Cu (copper). In addition, the non-magnetic material layer 4 may also be applied to a TMR element formed using an insulation layer. The free magnetic layer 5 may be formed using a soft magnetic material such as NiFe, CoFe, or CoFeNi. While, in the structure illustrated in FIG. 1, the free magnetic layer 5 may have a laminated structure including a CoFe alloy layer 5a and a NiFe alloy layer 5b, the structure of the free magnetic layer 5 is not limited. In other words, the material of the free magnetic layer 5 may not limited, and it may not be considered whether the free magnetic layer 5 has a single layer structure, a laminated structure, or an AAF structure. The protective layer 6 may be formed using a non-magnetic material such as Ta (tantalum).

In addition, a structure may be adopted where the free magnetic layer 5, the non-magnetic material layer 4, and the fixed magnetic layer (the order of the second magnetic layer 3c, the non-magnetic intermediate layer 3b, and the first magnetic layer 3a from the bottom) 3 are laminated in this order.

Incidentally, to enhance the coercive force Hc of the first magnetic layer 3a, to adjust a difference in magnetization amount between the first magnetic layer 3a and the second magnetic layer 3c so that the difference in magnetization amount may become substantially zero, and furthermore, to adjust the material or the film thickness t3 of the non-magnetic intermediate layer 3b, thereby enhancing an antiparallel coupling magnetic field owing to an RKKY mutual interaction occurring between the first magnetic layer 3a and the second magnetic layer 3c, may be important for enhancing the magnetization fixing force of the fixed magnetic layer 3.

The magnetic detecting element 1 may be a self-pinned type, and may have characteristic portions in that the film thickness t1 of the first magnetic layer 3a ($Fe_xCo_{100-x}$) falls within a range greater than or equal to 10 Å and less than or equal to 17 Å and in that the non-magnetic intermediate layer 3b may be formed using Rh.

By adopting the self-pinned type, magnetic field heat treatment may not be desired that is desired in the case of utilizing an antiferromagnetic layer. Accordingly, it may be possible to separately assign the anisotropies of the fixed magnetic layer 3 and the free magnetic layer 5 at the time of film formation. Accordingly, even if heat treatment in a non-magnetic field is implemented after film formation, it may be possible to cause the anisotropy at the time of the film formation to remain in each of the fixed magnetic layer 3 and the free magnetic layer 5. Therefore, it may be possible to decrease the coercive force Hc of the free magnetic layer 5 compared with a magnetic detecting element utilizing an antiferromagnetic layer, and it may be possible to obtain a magnetic characteristic suitable for a magnetic sensor such as a geomagnetism sensor, which does not embed therein a permanent magnet. In addition, according to the present embodiment, it may be possible to obtain a ΔMR characteristic (ΔMR-H curved line; the ΔMR indicates a resistance change rate, and the H is an external magnetic field) where a hysteresis is small and linearity is good, and it may be possible to obtain good detection accuracy.

In addition, since, in the self-pinned-type magnetic detecting element 1, the film thickness t1 of the first magnetic layer 3a ($Fe_xCo_{100-x}$) is caused to fall within a range greater than or equal to 10 Å and less than or equal to 17 Å and the non-magnetic intermediate layer 3b is formed using Rh, it may be possible to obtain good disturbance noise tolerance. While the film thickness t1 of the first magnetic layer 3a may be less than or equal to 17 Å, if the film thicknesses t1 and t2 of the first magnetic layer 3a and the second magnetic layer 3c, respectively, are too thick, an antiparallel coupling magnetic field Hex may become small that is due to the RKKY mutual interaction acting between the first magnetic layer 3a and the second magnetic layer 3c through the non-magnetic intermediate layer 3b. As a result, the ΔMR may be destabilized.

Among the antiparallel coupling magnetic field Hex, the individual film thicknesses t1 and t2, and the individual saturation magnetizations Ms1 and Ms2 of the magnetic layers 3a and 3c, a relationship illustrated in the following [Expression 1] exists.

$$E \propto Hex \times (Ms1 \times t1 + Ms2 \times t2) \quad \text{(Expression 1)}$$

Here, the E is interlayer exchange coupling energy, and the interlayer exchange coupling energy E is a fixed value. Therefore, on the basis of [Expression 1], it may be understood that the antiparallel coupling magnetic field Hex decreases with an increase in each of the film thicknesses t1 and t2.

By causing the film thickness t1 of the first magnetic layer 3a to be less than or equal to 17 Å, it may be possible to suppress magnetization dispersion and it may be possible to keep a ΔMR deterioration rate low. Here, the ΔMR deterioration rate is indicated by ΔMR/ΔMR (initial stage), which is obtained by measuring the ΔMR (initial stage) after the film formation of the magnetic detecting element 1 and subsequently, measuring the ΔMR again after an external magnetic field (disturbance magnetic field) may be applied to the magnetic detecting element 1. In particular, according to an experiment described later, it was understood that the ΔMR deterioration rate, obtained by forming the non-magnetic intermediate layer 3b using Rh and causing the film thickness t1 of the first magnetic layer 3a to be less than or equal to 17 Å in such a way as the present embodiment, may be smaller than a minimum value of a ΔMR deterioration rate in a comparative example where the non-magnetic intermediate layer 3b is formed using Ru.

In addition, in the present embodiment, by causing the film thickness t1 of the first magnetic layer 3a to be greater than or equal to 10 Å, it may be possible to maintain the coercive force Hc of the first magnetic layer 3a at a high value, specifically, a value greater than or equal to approximately 30 (kA/m), and even more specifically a value greater than or equal to approximately 40 (kA/m), and yet even more specifically a value greater than or equal to approximately 50 (kA/m).

If the film thickness t1 of the first magnetic layer 3a is thinned, it may also be desired to thin the film thickness t2 of the second magnetic layer 3c so as to maintain magnetization balance. However, if the film thickness t2 of the second magnetic layer 3c is thinned, the mean free path of free electrons may be decreased where spin-dependent scattering occurs in an interface with the non-magnetic material layer 4 serving as the source origin of a magnetoresistance effect, and as a result, the ΔMR is decreased. In the present embodiment, when the magnetic detecting element 1 illustrated in FIG. 1 is used for a magnetic sensor such as a geomagnetism sensor or a current sensor, which does not embed therein a permanent magnet, the film thickness t1 of the first magnetic layer 3a may be set to approximately 10 Å or more so as to secure a ΔMR greater than or equal to approximately 10%.

In addition, in the present embodiment, the film thickness t1 of the first magnetic layer 3a may be greater than or equal to approximately 10 Å and less than or equal to approximately 13 Å. According to an experiment described later, by setting the film thickness t1 of the first magnetic layer 3a to a value greater than or equal to approximately 10 Å and less than or equal to approximately 13 Å, it may be possible to stabilize the ΔMR deterioration rate at about a minimum value.

In addition, in the present embodiment, the film thickness t1 of the first magnetic layer 3a may be set to a value greater than or equal to approximately 10 Å and less than or equal to approximately 12.5 Å. It may be possible to further stabilize the ΔMR deterioration rate at about a minimum value. In addition, at this time, the film thickness t2 of the second magnetic layer 3c is about 12 Å to 16 Å.

In the present embodiment, the film thickness t3 of the non-magnetic intermediate layer 3b including Rh may be greater than or equal to approximately 4.9 Å and less than or equal to approximately 5.9 Å. Accordingly, it may be possible to stably obtain a high ΔMR.

In addition, the first magnetic layer 3a may be formed using $Fe_xCo_{100-x}$, and an Fe composition ratio x is more suitable as drawing nigh to 60 at %, and in the present embodiment, the Fe composition ratio x may be set within a range of 55 at % to 65 at %. Accordingly, it may be possible to stably set the coercive force Hc of the FeCo alloy layer to a high value.

Figure 2A:
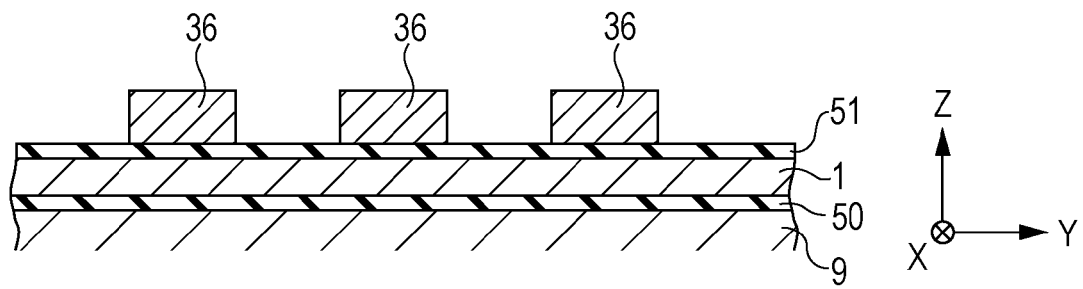
FIGS. 2A, 2B, and 2C are partial vertical cross-sectional views each of which illustrates a positional relationship between the magnetic detecting element illustrated in FIG. 1 and a hard bias layer connected to the magnetic detecting element.
Figure 2B:
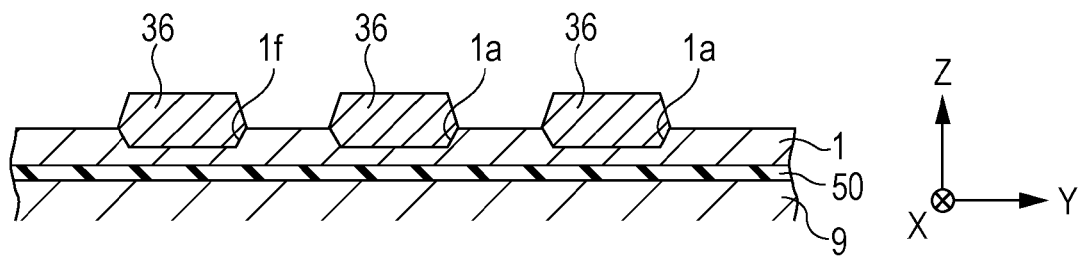
Figure 2C:
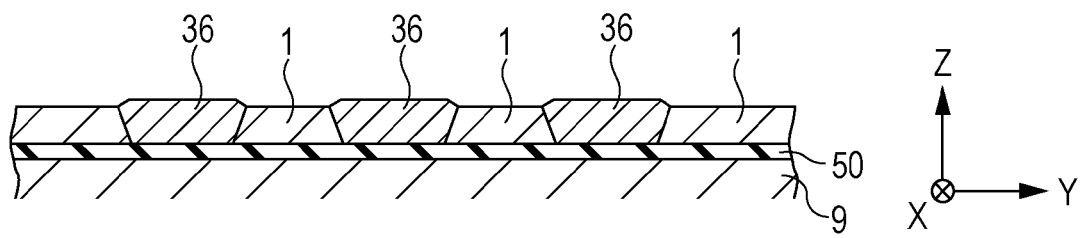

FIGS. 2A to 2C are partial vertical cross-sectional views each of which illustrates a positional relationship between the magnetic detecting element 1 illustrated in FIG. 1 and a hard bias layer connected to the magnetic detecting element 1.

As illustrated in FIG. 2A, the magnetic detecting element 1 may be formed on a supporting substrate 9 through an insulation layer 50. As illustrated in FIG. 2A, an insulation layer 51 may be provided on the magnetic detecting element 1, and each hard bias layer 36 may be formed on the planarized surface of the insulation layer 51.

Also, as illustrated in FIG. 2B, a portion of the magnetic detecting element 1 may be removed, and the hard bias layer 36 may also be formed on a concave portion if from which the portion is removed. Also, as illustrated in FIG. 2C, a configuration may also be adopted where all the magnetic detecting elements 1 at the formation positions of the hard bias layers 36 are removed and each hard bias layer 36 may be caused to lie between the separated magnetic detecting elements 1.

Accordingly, a bias magnetic field may be applied, from an Y direction, to the free magnetic layer 5 (refer to FIG. 1) configuring the magnetic detecting element 1, and the magnetization of the free magnetic layer 5 may be pointed in a direction perpendicular to the fixed magnetization direction of the fixed magnetic layer 3.

Also, in the present embodiment, a structure may also be adopted where the hard bias layer 36 is not formed or a non-magnetic conductive layer (electrode layer) may be formed at the position of the hard bias layer 36.

In a magnetic detecting element utilizing an antiferromagnetic layer, magnetic field heat treatment is desired. Therefore, the coercive force Hc of the free magnetic layer becomes large, and even if a configuration including the above-mentioned bias structure or a configuration to which shape anisotropy is assigned is adopted, a ΔMR whose linearity is deteriorated is only obtained, and detection accuracy is easily decreased. On the other hand, in the present embodiment, since the self-pinned-type magnetic detecting element may be adopted, the magnetic field heat treatment is not desired, and hence, it may be possible to decrease the coercive force Hc of the free magnetic layer. Accordingly, by adopting the configuration including the above-mentioned bias structure or the configuration to which the shape anisotropy is assigned, it may be possible to adequately assign the anisotropy of the free magnetic layer 5 in a direction perpendicular to the fixed magnetization direction of the fixed magnetic layer 3, it may be possible to obtain a ΔMR characteristic whose linearity is good, and it may be possible to improve detection accuracy.

In the present embodiment, a meander shape is adopted where a plurality of the magnetic detecting elements 1 extending longwise in the Y direction illustrated in FIGS. 2A to 2C may be disposed with being spaced from each other in an X direction and the end portions of the individual magnetic detecting elements 1 may be connected to each other by a conductive layer.

Figure 3:
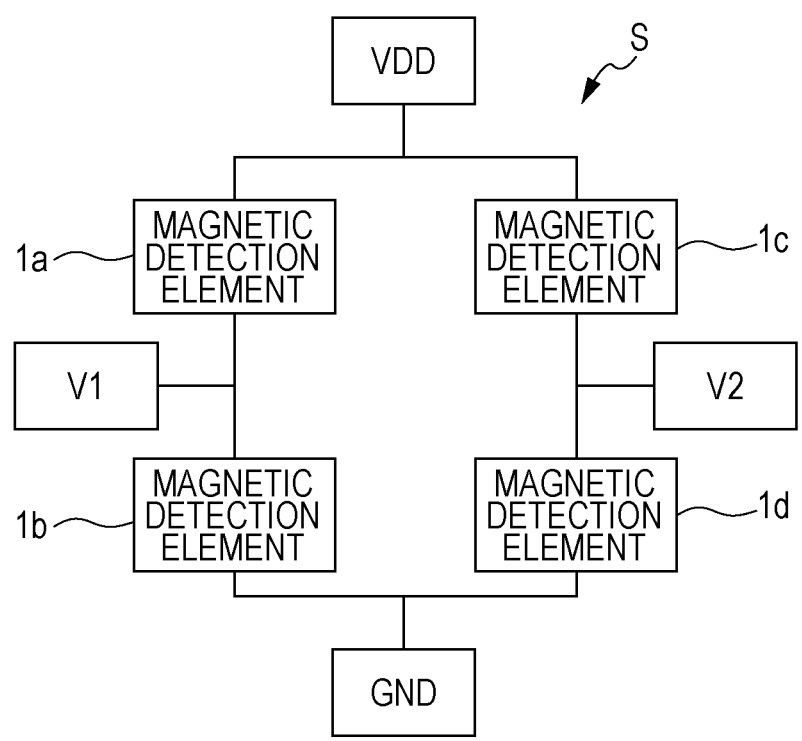
FIG. 3 is a circuit configuration diagram of a magnetic sensor in an exemplary embodiment.

The plural magnetic detecting elements 1 configured in this way using the meander shape may be provided to configure a bridge circuit illustrated in FIG. 3. In FIG. 3, so as to discriminate the individual magnetic detecting elements 1 from one another, the individual magnetic detecting elements 1 may be defined as magnetic detecting elements 1a to 1d. From among these, the magnetic detecting element 1a and the magnetic detecting element 1d have a same sensitivity axis direction, and the sensitivity axis directions of the magnetic detecting element 1b and the magnetic detecting element 1c may be directions opposite to those of the magnetic detecting elements 1a and 1d. The sensitivity axis direction may be the fixed magnetization direction (P2) of the second magnetic layer 3c configuring the fixed magnetic layer 3 illustrated in FIG. 1. Accordingly, if the sensitivity axis directions of the magnetic detecting element 1a and the magnetic detecting element 1d correspond to the P2 illustrated in FIG. 1, the sensitivity axis directions of the magnetic detecting element 1b and the magnetic detecting element 1c may correspond to a direction opposite to the P2 illustrated in FIG. 1.

In addition, the magnetic detecting element 1a and the first magnetic detecting element 1b may be connected in series to each other, and the magnetic detecting element 1c and the magnetic detecting element 1d may be connected in series to each other. The magnetic detecting elements 1a and 1c may be connected to an input terminal (Vdd), the magnetic detecting elements 1b and 1d may be connected to a ground terminal (GND), and output terminals (V1, V2) may be connected between the magnetic detecting element 1a and the magnetic detecting element 1b and between the magnetic detecting element 1c and the first magnetic detecting element 1d, respectively.

A magnetic sensor S illustrated in FIG. 3 is, for example, a geomagnetism sensor embedded in a mobile phone, and no permanent magnet is embedded in the geomagnetism sensor. The geomagnetism sensor may detect the azimuth of geomagnetism by detecting the weak geomagnetism.

For example, when the geomagnetism (an external magnetic field to be detected) has affected the bridge circuit illustrated in FIG. 3, if the direction of the geomagnetism is the same as the sensitivity axis directions of the magnetic detecting elements 1a and 1d, the electrical resistance values of the magnetic detecting elements 1a and 1d may be minimized. On the other hand, since the direction of the geomagnetism is a direction opposite to the sensitivity axis directions of the magnetic detecting elements 1b and 1c, the electrical resistance values of the magnetic detecting elements 1b and 1c may become maximum values. Therefore, it may be possible to obtain an output.

In the present embodiment, disturbance noise tolerance may be strengthened so as to stably detect the geomagnetism with a high sensitivity.

According to the configuration of the magnetic detecting element 1 of the present embodiment, it may be possible to effectively improve the disturbance noise tolerance as illustrated in an experimental result described later.

The magnetic sensor in the present embodiment may be applicable to a magnetic sensor not embedding therein a permanent magnet such as a current sensor, in addition to the geomagnetism sensor.

The following exemplary self-pinned-type GMR element (giant magnetoresistance effect element) was manufactured.

Substrate/seed layer: NiFeCr (42)/fixed magnetic layer [first magnetic layer: $Fe_{60\ at\ \%}Co_{40\ at\ \%}$ (t1)/non-magnetic intermediate layer: (t3)/second magnetic layer $Co_{90\ at\ \%}Fe_{10\ at\ \%}$ (t2)]/non-magnetic material layer: Cu (22)/free magnetic layer [$Co_{90\ at\ \%}Fe_{10\ at\ \%}$ (15)/NiFe (17)]/protective layer: Ta (70)

A numerical value in parentheses in each layer indicates a film thickness, and the unit thereof is Å.

In an exemplary GMR-1 embodiment, the film thickness t1 of the first magnetic layer was set to 10 Å, the film thickness t2 of the second magnetic layer was set to 12 Å, the non-magnetic intermediate layer was formed using Rh, and the film thickness t3 of the non-magnetic intermediate layer was set to 5.4 Å.

In an exemplary GMR-2 comparative example, the film thickness t1 of the first magnetic layer was set to 18.3 Å, the film thickness t2 of the second magnetic layer was set to 24 Å, the non-magnetic intermediate layer was formed using Rh, and the film thickness t3 of the non-magnetic intermediate layer was set to 5.4 Å.

In an exemplary GMR-3 comparative example, the film thickness t1 of the first magnetic layer was set to 11 Å, the film thickness t2 of the second magnetic layer was set to 12 Å, the non-magnetic intermediate layer was formed using Ru, and the film thickness t3 of the non-magnetic intermediate layer was set to 3.6 Å.

In an exemplary GMR-4 comparative example, the film thickness t1 of the first magnetic layer was set to 18.6 Å, the film thickness t2 of the second magnetic layer was set to 24 Å, the non-magnetic intermediate layer was formed using Ru, and the film thickness t3 of the non-magnetic intermediate layer was set to 3.6 Å.

A difference in magnetization amount between the first magnetic layer and the second magnetic layer of each GMR element is substantially zero.

The above-mentioned individual GMR elements were subjected to film formation under a room-temperature environment.

Figure 4:
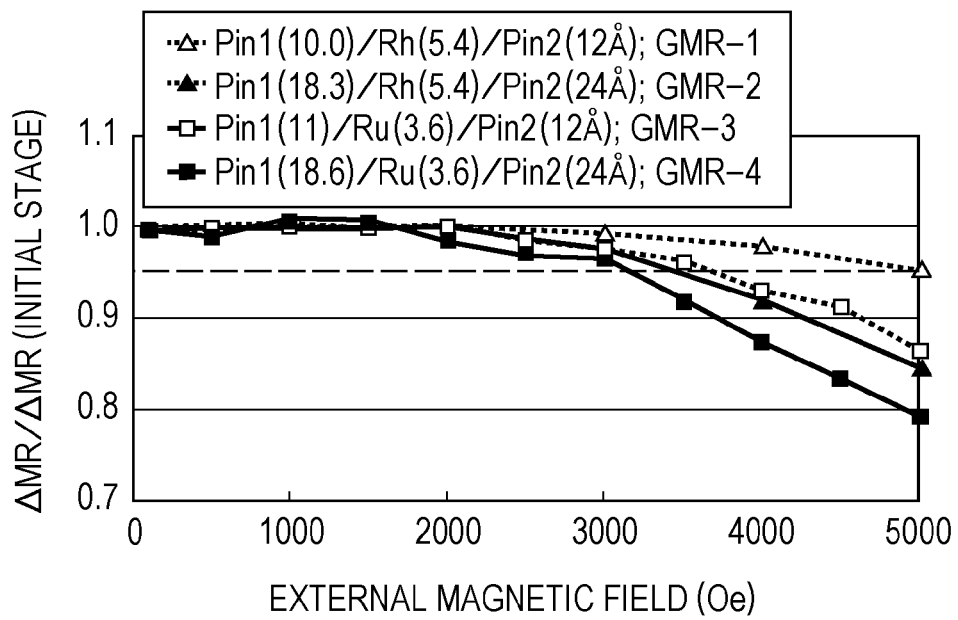
FIG. 4 is a graph illustrating a relationship between an external magnetic field and ΔMR/ΔMR (initial stage) in a magnetic detecting element utilizing Rh as a non-magnetic material layer and a magnetic detecting element utilizing Ru as a non-magnetic material layer, in a plurality of self-pinned-type magnetic detecting elements where film thicknesses of a first magnetic layer and a second magnetic layer are different from each other.

In an experiment, after an external magnetic field (magnetic field to be detected) of 100 Oe (initial stage) was applied to each GMR element in the fixed magnetization direction of the fixed magnetic layer first, a ΔMR (initial stage) was measured. Furthermore, an external magnetic field (disturbance magnetic field) of 500 to 5000 Oe was applied to each sample in the fixed magnetization direction of the fixed magnetic layer, and after that, an external magnetic field (magnetic field to be detected) of 100 Oe was applied again in the fixed magnetization direction of the fixed magnetic layer first, thereby measuring a ΔMR. In addition, the ΔMR measured after the application of the external magnetic field (disturbance magnetic field) of 500 to 5000 Oe was divided by the ΔMR (initial stage), and a relationship between the external magnetic field and ΔMR/ΔMR (initial stage) was obtained. FIG. 4 illustrates the experimental result.

In addition, measurement points on a leftmost side in FIG. 4 correspond to ΔMR (initial stage)/ΔMR (initial stage) in individual GMR elements, and all measurement points correspond to 1.

As illustrated in FIG. 4, it was understood that the ΔMR/ΔMR (initial stage) of the GMR-1 was the most stable. In other words, it was understood that, in the case of the GMR-1, ΔMR was less likely to be decreased owing to the application of the external magnetic field (disturbance magnetic field) and the GMR-1 had good disturbance noise tolerance, compared with the GMR-2 to GMR-4.

When taking a closer look at each GMR element, in the GMR-4, the ΔMR/ΔMR (initial stage) after the application of the external magnetic field (disturbance magnetic field) of 3500 Oe or more fell below 0.95. In addition, in the GMR-2 and the GMR-3, the ΔMR/ΔMR (initial stage) after the application of the external magnetic field (disturbance magnetic field) of 4000 Oe or more fell below 0.95.

On the other hand, it might be possible to maintain, at about 0.95, the ΔMR/ΔMR (initial stage) of the GMR-1 even after the application of the external magnetic field (disturbance magnetic field) of 5000 Oe.

The GMR-1 is a self-pinned-type GMR element where Rh is used for the non-magnetic intermediate layer and the film thickness of the second magnetic layer is set to 12 Å. On the other hand, the GMR-3 is a self-pinned-type GMR element where Ru is used for the non-magnetic intermediate layer and the film thickness of the second magnetic layer is set to 12 Å. With respect to the GMR-1 and the GMR-3, the film thickness of the second magnetic layer was set to substantially the same thickness, and the film thickness of the first magnetic layer was changed and adjusted so that a difference in magnetization amount (Ms·t) between the first magnetic layer and the second magnetic layer became substantially zero.

As may be clear from a comparison between the GMR-1 and the GMR-3, it was understood that it may be possible to dramatically improve the ΔMR/ΔMR (initial stage) using Rh for the non-magnetic intermediate layer and it may be possible to obtain good disturbance noise tolerance.

In addition, while each of the GMR-1 and the GMR-2 is a self-pinned-type GMR element where Rh is used for the non-magnetic intermediate layer, it was understood that it may be possible for the GMR-1 to obtain better ΔMR/ΔMR (initial stage) than the GMR-2. The reason is that the film thickness of the first magnetic layer and the film thickness of the second magnetic layer in the GMR-1 are thinner than those in the GMR-2. Therefore, an experiment relating to the film thickness of the first magnetic layer was performed in what follows.

Figure 5:
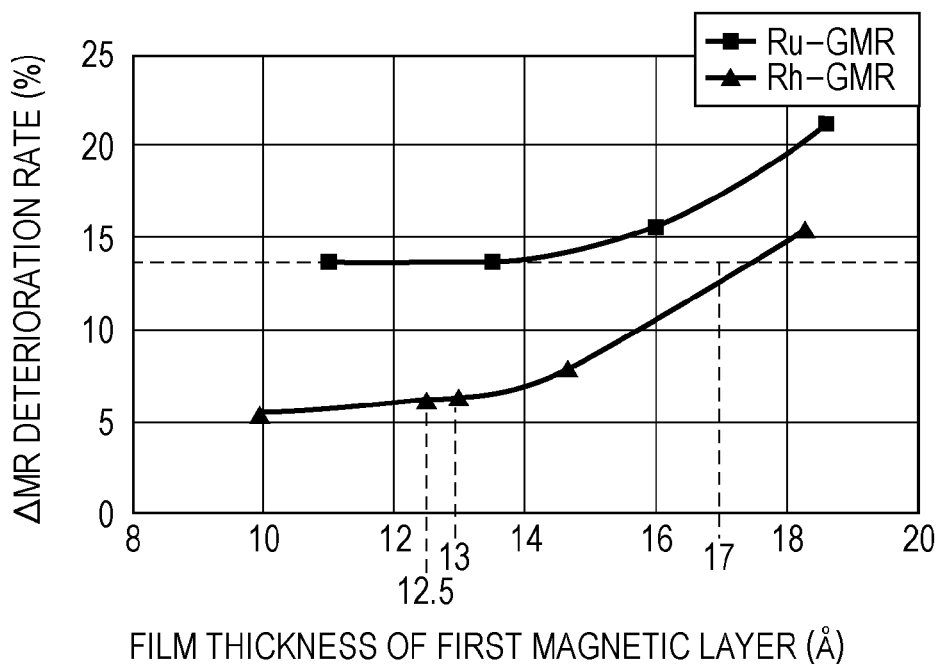
FIG. 5 is a graph illustrating a relationship between the film thickness of the first magnetic layer and a ΔMR deterioration rate (after application of 5 KOe)

FIG. 5 is a graph where a horizontal axis corresponds to the film thickness of the first magnetic layer and a vertical axis corresponds to a ΔMR deterioration rate. In addition, in the experiment in FIG. 5, Rh (the film thickness thereof was fixed to 5.4 Å) or Ru (the film thickness thereof was fixed to 3.6 Å) was used for the non-magnetic intermediate layer, the film thickness of the second magnetic layer was also changed in keeping with a change in the film thickness of the first magnetic layer, and a balance was kept so that a difference in magnetization amount between the first magnetic layer and the second magnetic layer became substantially zero. A film configuration other than the fixed magnetic layer is the same as the film configuration used in the experiment in FIG. 4.

The ΔMR deterioration rate in FIG. 5 is indicated by [(ΔMR (initial stage)−ΔMR (after the application of 5 kOe))/ΔMR (initial stage)]×100 (%).

As illustrated in FIG. 5, in a self-pinned-type GMR element (referred to as an Rh-GMR hereinafter) where Rh was used for the non-magnetic intermediate layer, it might be possible to obtain a ΔMR deterioration rate lower than a self-pinned-type GMR element (referred to as an Ru-GMR hereinafter) where Ru was used for the non-magnetic intermediate layer.

As illustrated in FIG. 5, in the Ru-GMR, as the film thickness of the first magnetic layer (and the second magnetic layer) is thinned, the ΔMR deterioration rate gradually becomes small, and it may be possible to improve the ΔMR deterioration to some extent. However, it was understood that when the film thickness of the first magnetic layer was thinned to be about 14 Å, the ΔMR deterioration rate was inclined to be saturated, and it was difficult to further decrease the ΔMR deterioration rate. In the Ru-GMR illustrated in the experiment in FIG. 5, the minimum value of the ΔMR deterioration rate was about 13.5%.

On the other hand, when the ΔMR deterioration rate of the Rh-GMR and the ΔMR deterioration rate of the Ru-GMR were compared with each other with respect to the same film thickness of the first magnetic layer, the ΔMR deterioration rate of the Rh-GMR was invariably lower than the ΔMR deterioration rate of the Ru-GMR.

In addition, in the Rh-GMR, even if the film thickness of the first magnetic layer was set to 14 Å or less, the improvement effect of the ΔMR deterioration rate was found.

As described above, the minimum value of the ΔMR deterioration rate (after the application of an external magnetic field of 5 kOe) in the Ru-GMR was about 13.5%. In addition, as illustrated in FIG. 5, it was understood that, by setting the film thickness of the first magnetic layer of the Rh-GMR to 17 Å or less, it might be possible to obtain a ΔMR deterioration rate invariably lower than that of the Ru-GMR.

In addition, it was understood that when, in the Rh-GMR, the film thickness of the first magnetic layer was set to 13 Å or less, it might be possible to stabilize the ΔMR deterioration rate at about a minimum value. Furthermore, it was understood that when, in the Rh-GMR, the film thickness of the first magnetic layer was set to 12.5 Å or less, it might be possible to more effectively stabilize the ΔMR deterioration rate at about a minimum value.

In addition, while the experiment in FIG. 5 was evaluated using the ΔMR deterioration rate after the application of the external magnetic field of 5 kOe, even if the magnetic field intensity of the external magnetic field (disturbance magnetic field) changes, the curvilinear trend of the graph may be considered to be about the same as FIG. 5 with the magnitude of the ΔMR deterioration rate only changing. Accordingly, it may be considered that, regardless of the magnetic field intensity of the external magnetic field (disturbance magnetic field), by setting the film thickness of the first magnetic layer to 17 Å or less in the Rh-GMR, it may be possible to obtain a ΔMR deterioration rate invariably lower than that of the Ru-GMR.

In addition, since the external magnetic field (disturbance magnetic field) of 5 kOe is a maximum value in the experiment illustrated in FIG. 4, if the film thickness of the first magnetic layer may be set to 13 Å or less, it may be possible to set the ΔMR deterioration rate to 5% or less with respect to the application of the external magnetic field (disturbance magnetic field) of 5 kOe or less.

Figure 6:
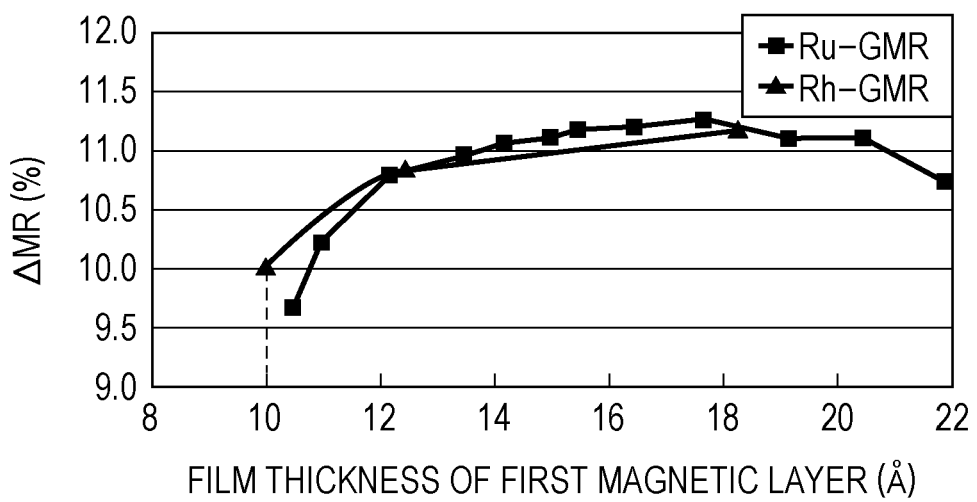
FIG. 6 is a graph illustrating a relationship between the film thickness of the first magnetic layer and a ΔMR.

FIG. 6 is a graph illustrating a relationship between the film thickness of the first magnetic layer and a ΔMR in each of the Rh-GMR and the Ru-GMR used in the experiment in FIG. 5. The ΔMR illustrated in FIG. 6 corresponds to a ΔMR (initial stage).

As illustrated in FIG. 6, when the film thickness of the first magnetic layer became greater than or equal to 12 Å, no appreciable difference between the ΔMR of the Rh-GMR and the ΔMR of the Ru-GMR was found. However, when the film thickness of the first magnetic layer was set to 12 Å or less, the ΔMR of the Rh-GMR became slightly larger than the ΔMR of the Ru-GMR.

In this regard, however, also in the Rh-GMR, it may be estimated that when the film thickness of the first magnetic layer is thinned to be about 10 Å, the ΔMR is decreased to about 10% and when the film thickness of the first magnetic layer is further thinned, the ΔMR is rapidly decreased.

The ΔMR has a relationship with the coercive force Hc of the first magnetic layer. In other words, so as to cause a magnetoresistance effect to emerge, the first magnetic layer may have a high Hc. Therefore, next, it was intended to measure the coercive force Hc of the first magnetic layer.

The following laminated film was formed.

Substrate/seed layer: NiFeCr (42)/first magnetic layer: $Fe_{60\ at\ \%}Co_{40\ at\ \%}$ (X)/non-magnetic intermediate layer: Ru (3.6)/non-magnetic material layer: Cu (22)/protective layer: Ta (50)

A numerical value in parentheses in each layer indicates a film thickness, and the unit thereof is Å.

No second magnetic layer and no free magnetic layer are formed in the above-mentioned laminated film. This is to suitably measure the coercive force Hc of the first magnetic layer.

Figure 7:
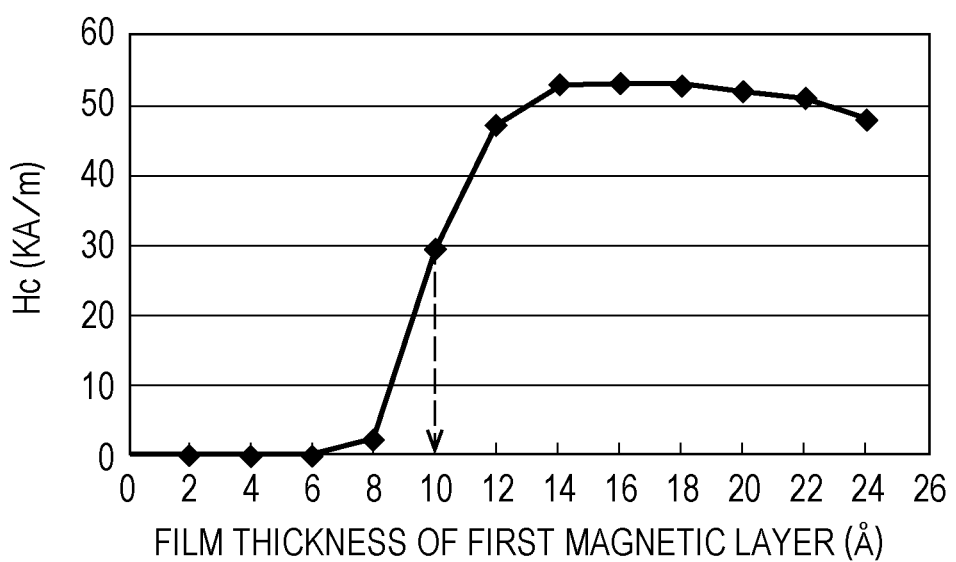
FIG. 7 is a graph illustrating a relationship between the film thickness of the first magnetic layer and a coercive force Hc.

FIG. 7 is a graph illustrating a relationship between the film thickness of the first magnetic layer and the coercive force Hc of the first magnetic layer.

As illustrated in FIG. 7, when the film thickness of the first magnetic layer became smaller than 10 Å, the ferromagnetic property thereof became weak, and the rapid decrease of the coercive force Hc was found. Since leading to magnetization dispersion, the decrease of the ΔMR, and decreased reliability, the decrease of the coercive force Hc is undesirable.

Therefore, on the basis of the experimental results in FIG. 6 and FIG. 7, the film thickness of the first magnetic layer was set to 10 Å or more.

From the above, in the present embodiment, in a self-pinned-type magnetic detecting element utilizing Rh for a non-magnetic intermediate layer, the film thickness of the first magnetic layer was set to 10 Å or more and 17 Å or less, and a desirable range was defined as 10 Å or more and 13 Å or less. Furthermore, the range of the film thickness of the first magnetic layer was set to 10 Å or more and 12.5 Å or less.

Next, the following self-pinned-type GMR element was manufactured.

Substrate/seed layer: NiFeCr (42)/fixed magnetic layer [first magnetic layer: $Fe_{60\ at\ \%}Co_{40\ at\ \%}$ (18.7)/non-magnetic intermediate layer: Rh (t3)/second magnetic layer $Co_{90\ at\%}Fe_{10\ at\ \%}$ (24)]/non-magnetic material layer: Cu (22)/ free magnetic layer [$Co_{90\ at\ \%}Fe_{10\ at\ \%}$ (15)/NiFe (17)]/protective layer: Ta (70)

A numerical value in parentheses in each layer indicates a film thickness, and the unit thereof is Å.

In an experiment, first, an external magnetic field (magnetic field to be detected) of 100 Oe was applied, in the fixed magnetization direction of the fixed magnetic layer first, to a self-pinned-type GMR element where the film thickness of the non-magnetic intermediate layer including Rh was set to 5.4 Å, and a ΔMR (Rh=5.4 Å) was measured.

Subsequently, an external magnetic field (magnetic field to be detected) of 100 Oe was applied, in the fixed magnetization direction of the fixed magnetic layer first, to a self-pinned-type GMR element where the film thickness of the non-magnetic intermediate layer including Rh was changed within a range of 4.5 Å to 6.5 Å, and a ΔMR was measured. In addition, a relationship between the film thickness of the non-magnetic intermediate layer and ΔMR/ΔMR (Rh=5.4 Å) was obtained.

Figure 8:
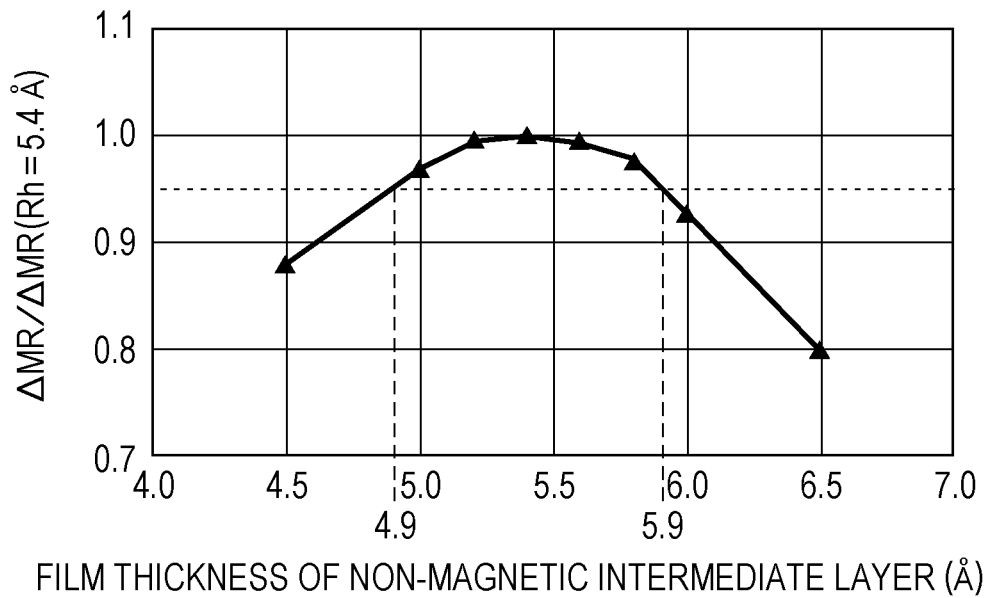
FIG. 8 is a graph illustrating a relationship between a film thickness of Rh and ΔMR/ΔMR (Rh=5.4 Å)

FIG. 8 illustrates the experimental result. Since the case where the film thickness of the non-magnetic intermediate layer was 5.4 Å corresponded to ΔMR (Rh=5.4 Å)/ΔMR (Rh=5.4 Å), ΔMR/ΔMR (Rh=5.4 Å) turned out to be "1", and the value was a maximum value. In other words, it was understood that if the film thickness of the non-magnetic intermediate layer including Rh was 5.4 Å, it might be possible to maximize the ΔMR. In addition, when the film thickness of the non-magnetic intermediate layer was set to 5.4 Å or less or 5.4 Å or more, the ΔMR/ΔMR (Rh=5.4 Å) was gradually decreased from "1".

As illustrated in FIG. 8, it was understood that, by setting the film thickness of the non-magnetic intermediate layer to 4.9 Å or more and 5.9 Å or less, it might be possible to cause the ΔMR/ΔMR (Rh=5.4 Å) to fall within a range greater than or equal to 0.95 (a ΔMR fluctuation rate to fall within 5%).

Next, the following self-pinned-type exemplary GMR element embodiment was manufactured.

Substrate/seed layer: NiFeCr (42)/fixed magnetic layer [first magnetic layer: $Fe_{60\,at\,\%}Co_{40\,at\,\%}$ (12.5)/non-magnetic intermediate layer: Rh (5.4)/second magnetic layer $Co_{90\,at\,\%}Fe_{10\,at\,\%}$ (16)]/non-magnetic material layer: Cu (20)/free magnetic layer [$Co_{90\,at\,\%}Fe_{10\,at\,\%}$ (5)/$Co_{70\,at\,\%}Fe_{30\,at\,\%}$ (3)/NiFe (30)]/protective layer: Ta (70)

A numerical value in parentheses in each layer indicates a film thickness, and the unit thereof is Å.

In addition, a GMR element (comparative example) utilizing the following antiferromagnetic layer was manufactured.

Substrate/seed layer: NiFeCr (60)/antiferromagnetic layer: PtMn (200)/fixed magnetic layer [first magnetic layer: $Co_{90\,at\,\%}Fe_{10\,at\,\%}$ (12.3)/non-magnetic intermediate layer: Ru (8.7)/second magnetic layer $Co_{90\,at\,\%}Fe_{10\,at\,\%}$ (10.5)]/non-magnetic material layer: Cu (20.5)/free magnetic layer [$Co_{90\,at\,\%}Fe_{10\,at\,\%}$ (12)/NiFe (20)]/protective layer: Ta (50)

A numerical value in parentheses in each layer indicates a film thickness, and the unit thereof is Å.

In addition, an external magnetic field (magnetic field to be detected) of –100 Oe to 100 Oe was applied in the fixed magnetization direction of the fixed magnetic layer of each GMR element in the embodiment and the comparative example, and a ΔMR was measured.

Figure 9:
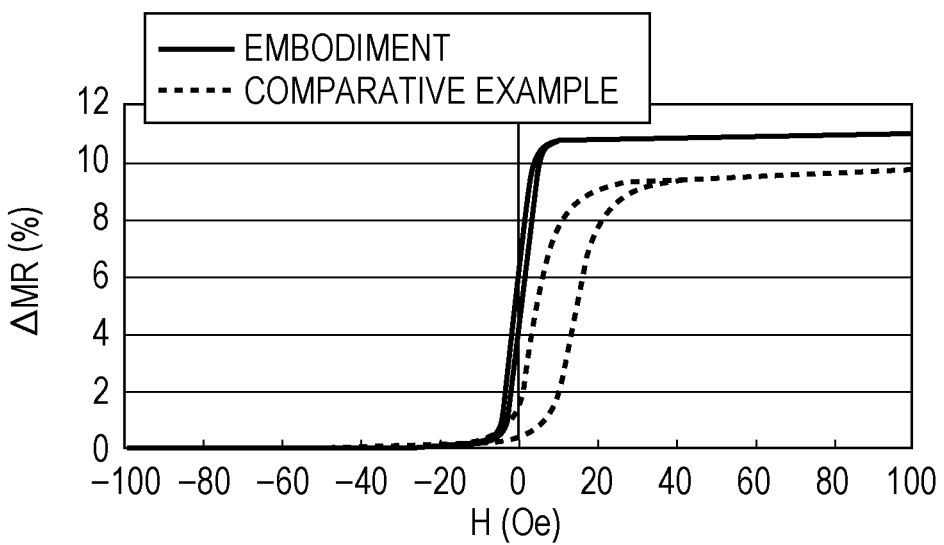
FIG. 9 is a graph illustrating ΔMR characteristics of a self-pinned-type magnetic detecting element in the present embodiment and a magnetic detecting element utilizing an antiferromagnetic layer in a comparative example.

FIG. 9 illustrates the experimental result. In addition, the directions of the external magnetic field H (magnetic field to be detected) of a plus value and the external magnetic field H (magnetic field to be detected) of a minus value indicate directions opposite to each other.

In addition, the device characteristics of the embodiment and the comparative example were studied, and the experimental results are illustrated in Table 1.

TABLE 1

| | R-H | | | | | | |
|---|---|---|---|---|---|---|---|
| | Rsmin (Ω/□) | Rc (Ω/□) | ΔMRmin (%) | ΔRs (Ω/□) | Hc (Oe) | Hin (Oe) | Hk (Oe) |
| Embodiment | 21.28 | 22.44 | 10.92 | 2.32 | 0.6 | 0.3 | 5.7 |
| Comparative example | 20.03 | 21.00 | 9.69 | 1.94 | 4.9 | 9.6 | 6.4 |

A noteworthy observation in Table 1 is the coercive force Hc of the free magnetic layer. As illustrated in Table 1, it was understood that the coercive force Hc of the free magnetic layer in the embodiment became sufficiently smaller than the comparative example.

In the exemplary GMR element (comparative example) utilizing the antiferromagnetic layer, magnetic field heat treatment is desired so as to cause an exchange-coupling magnetic field (Hex) to occur between the fixed magnetic layer and the antiferromagnetic layer. On the other hand, in the exemplary self-pinned-type GMR element (embodiment), the magnetic field heat treatment may not be desired, and it may be possible to separately assign the anisotropies of the fixed magnetic layer and the free magnetic layer at the time of film formation. Accordingly, even if heat treatment in a non-magnetic field is implemented after film formation, it may be possible to cause the anisotropy at the time of the film formation to remain in each of the fixed magnetic layer and the free magnetic layer. Therefore, it may be possible to decrease the coercive force Hc of the free magnetic layer compared with a GMR element utilizing an antiferromagnetic layer.

As clearly illustrated by the experimental result in FIG. 9, according to the embodiment, it might be possible to obtain the ΔMR characteristic where a hysteresis is small and linearity is good, compared with the comparative example.

Accordingly, the embodiments of the present inventions are not to be limited in scope by the specific embodiments described herein. Further, although some of the embodiments of the present disclosure have been described herein in the context of a particular implementation in a particular environment for a particular purpose, those of ordinary skill in the art should recognize that its usefulness is not limited thereto and that the embodiments of the present inventions can be beneficially implemented in any number of environments for any number of purposes. Accordingly, the claims set forth below should be construed in view of the full breadth and spirit of the embodiments of the present inventions as disclosed herein. While the foregoing description includes many details and specificities, it is to be understood that these have been included for purposes of explanation only, and are not to be interpreted as limitations of the invention. Many modifications to the embodiments described above can be made without departing from the spirit and scope of the invention.

What is claimed is:

1. A magnetic detecting element used in a magnetic sensor embedding therein no permanent magnet, the magnetic detecting element comprising:
   a laminated structure where a fixed magnetic layer and a free magnetic layer are laminated through a non-magnetic material layer, wherein
   the fixed magnetic layer is a self-pinned type where a first magnetic layer and a second magnetic layer are laminated through a non-magnetic intermediate layer and the first magnetic layer and the second magnetic layer are antiparallelly magnetization-fixed, the magnetization of the first magnetic layer is fixed, and the second magnetic layer is in contact with the non-magnetic material layer,
   the first magnetic layer is formed using FeCo serving as a material having a higher coercive force than the second magnetic layer,
   a film thickness of the first magnetic layer falls within a range greater than or equal to 10Å and less than or equal to 17 Å, and is thinner than a film thickness of the second magnetic layer,
   a ratio of the thickness of the first and second layers is adjusted so that a difference in magnetization amount between the first magnetic layer and the second magnetic layer is substantially zero, and
   the non-magnetic intermediate layer is formed using Rh.

2. The magnetic detecting element according to claim 1, wherein
   a film thickness of the non-magnetic intermediate layer is formed within a range greater than or equal to 4.9 Å and less than or equal to 5.9 Å.

3. The magnetic detecting element according to claim 1, wherein
the film thickness of the first magnetic layer is greater than or equal to 10 Å and less than or equal to 13 Å.

4. The magnetic detecting element according to claim 3, wherein
the film thickness of the first magnetic layer is greater than or equal to 10 Å and less than or equal to 12.5 Å.

5. The magnetic detecting element according to claim 1, wherein
the first magnetic layer is formed using $Fe_xCo_{100-x}$ (in this regard, however, the x is greater than or equal to 55 at % and less than or equal to 65 at %).

6. A magnetic sensor embedding therein no permanent magnet, wherein the magnetic detecting element according to claim 1 is disposed on a substrate.

* * * * *